United States Patent
Domino et al.

(10) Patent No.: US 7,548,737 B2
(45) Date of Patent: *Jun. 16, 2009

(54) SYSTEM AND APPARATUS FOR A DIRECT CONVERSION RECEIVER AND TRANSMITTER

(75) Inventors: William J. Domino, Yorba Linda, CA (US); Scott A. Griffin, San Clemente, CA (US); Dmitriy Rozenblit, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 474 days.

This patent is subject to a terminal disclaimer.

(21) Appl. No.: 11/219,483

(22) Filed: Sep. 2, 2005

(65) Prior Publication Data

US 2006/0019622 A1 Jan. 26, 2006

Related U.S. Application Data

(63) Continuation of application No. 09/621,407, filed on Jul. 21, 2000.

(51) Int. Cl.
   *H04B 1/18* (2006.01)
(52) U.S. Cl. .................................. 455/189.1
(58) Field of Classification Search ............ 455/73, 455/83–84, 86, 522.1, 78, 87, 75, 165.1, 455/42, 23–24, 109, 112, 260, 189.1
   See application file for complete search history.

(56) References Cited

U.S. PATENT DOCUMENTS

| | | | |
|---|---|---|---|
| 5,152,005 A | 9/1992 | Bickley | |
| 5,303,417 A | 4/1994 | Laws | |
| 6,104,745 A | 8/2000 | Koh | |
| 6,137,995 A | 10/2000 | Durec et al. | |
| 6,226,276 B1 | 5/2001 | Na | |
| 6,343,207 B1 | 1/2002 | Hessel et al. | |
| 6,347,219 B1 | 2/2002 | Takinami et al. | |
| 6,370,360 B1 | 4/2002 | Kunkel | |
| 6,397,044 B1 | 5/2002 | Nash et al. | |
| 6,658,237 B1 | 12/2003 | Rozenblit et al. | |

FOREIGN PATENT DOCUMENTS

| | | |
|---|---|---|
| EP | 085 165 A2 | 9/1998 |
| WO | WO 00/16492 | 3/2000 |
| WO | WO 00/19621 | 4/2000 |

OTHER PUBLICATIONS

International Search Report for PCT/US2001/22653 dated Jun. 19, 2002 (4 pgs.).

Kawakami et al., "Fully Monolithic Integrated Even Harmonic Quadrature Ring Mixer With an Active Matched 90 Degree Power Divider for Direct Conversion Receiver," Information Technology R & D Electric Corp., Kanagawa, Japan, 1997, IEEE MTT-S Digest.

*Primary Examiner*—Melody Mehrpour

(57) ABSTRACT

A system for transmitting and receiving data is provided. The system includes a direct-conversion receiver that receives a signal modulated on a carrier frequency signal. The direct-conversion receiver includes one or more subharmonic local oscillator mixers. A local oscillator is connected to the direct conversion receiver, and generates a signal having a frequency equal to a subharmonic of the carrier frequency signal. A transmitter is connected to the local oscillator, which uses the local oscillator signal to transmit outgoing data.

6 Claims, 5 Drawing Sheets

SYSTEM AND APPARATUS FOR A DIRECT CONVERSION RECEIVER AND TRANSMITTER

RELATED CASES

This case is a continuation application of U.S. application Ser. No. 09/621,407, filed Jul. 21, 2000, and is related to U.S. Pat. No. 6,360,087 "DIRECT CONVERSION RECEIVER," filed Mar. 2, 1999, which is commonly owned and assigned with the present application and which is incorporated by reference herein for all purposes.

FIELD OF THE INVENTION

The present invention pertains to the field of data transmission. More specifically, the invention relates to a system and apparatus for data transmission that allows a direct conversion receiver and transmitter to be used without the shielding or offset circuitry for a direct current component in the received signal that is normally required for such direct conversion receivers and transmitters.

BACKGROUND

Direct conversion receivers are known in the art. In a direct conversion receiver, the received carrier frequency signal with the data signal modulated on it is mixed with a signal from a local oscillator having the same frequency as the carrier frequency. The signal product of these two signals is a signal having components at the base band and at two times the carrier frequency. The high frequency component can be filtered using a low pass filter, such that the data signal remains in the base band signal. The base band signal is then processed to extract the data encoded in the transmitted signal.

One drawback of direct conversion receivers is that the local oscillator can radiate a leakage signal that may be stronger than the signal transmitted and received by the antenna. In this configuration, it is possible for the local oscillator signal to be received at the antenna of the direct conversion receiver or at intermediate points between the antenna and the mixer. If this condition occurs, the radiated local oscillator signal is received and mixed with the local oscillator signal that is provided directly at the input of the mixer, which creates a significant DC signal component in the output from the mixer.

In order to prevent the generation of a DC signal from such feedback, shielding or filtering can be performed. Likewise, it is also possible to offset the DC signal by applying a DC signal that is equal to that created by the leakage signal from the local oscillator and having a reverse polarity. Both shielding and offsetting the DC signal require additional costs, such as the cost and expense of shielding, the additional weight of shielding, the additional power required to generate the DC offset, and other similar costs.

Thus, while direct conversion receivers have some utility, the additional costs required to shield the direct conversion receiver antenna from the local oscillator or to offset the DC signal can significantly increase the weight and costs of the direct conversion receiver. The increased weight and cost of the direct conversion receiver limits the types of applications in which the direct conversion receiver can be effectively used.

SUMMARY OF THE INVENTION

In accordance with the present invention, a system and method for a direct conversion receiver and transmitter are provided that overcome known problems with direct conversion receivers and transmitters.

In particular, a system and method for a direct conversion receiver and transmitter are provided that allow the local oscillator for a direct conversion receiver to also be used for an associated transmitter, thus reducing the number of components required to receive and transmit data.

In accordance with an exemplary embodiment of the present invention, a system for transmitting and receiving data is provided. The system includes a direct-conversion receiver that receives a signal modulated on a carrier frequency signal. The direct-conversion receiver includes one or more subharmonic local oscillator mixers. A local oscillator is connected to the direct conversion receiver, and generates a signal having a frequency equal to a subharmonic of the carrier frequency signal. A transmitter is connected to the local oscillator, which uses the local oscillator signal to transmit outgoing data.

The present invention provides many important technical advantages. One important technical advantage of the present invention is a system and method for receiving and transmitting data that uses a single local oscillator to both receive and transmit data. The present invention uses a subharmonic local oscillator to minimize the effect of leakage fields from the local oscillator on the received signal. In addition, the receiver and transmitter can, if the communications system requires it, both operate at the same frequency, such as by allocating time slots to the receive and transmit functions.

Those skilled in the art will further appreciate the advantages and superior features of the invention together with other important aspects thereof on reading the detailed description that follows in conjunction with the drawings.

DETAILED DESCRIPTION OF PREFERRED EMBODIMENTS

Figure 1:
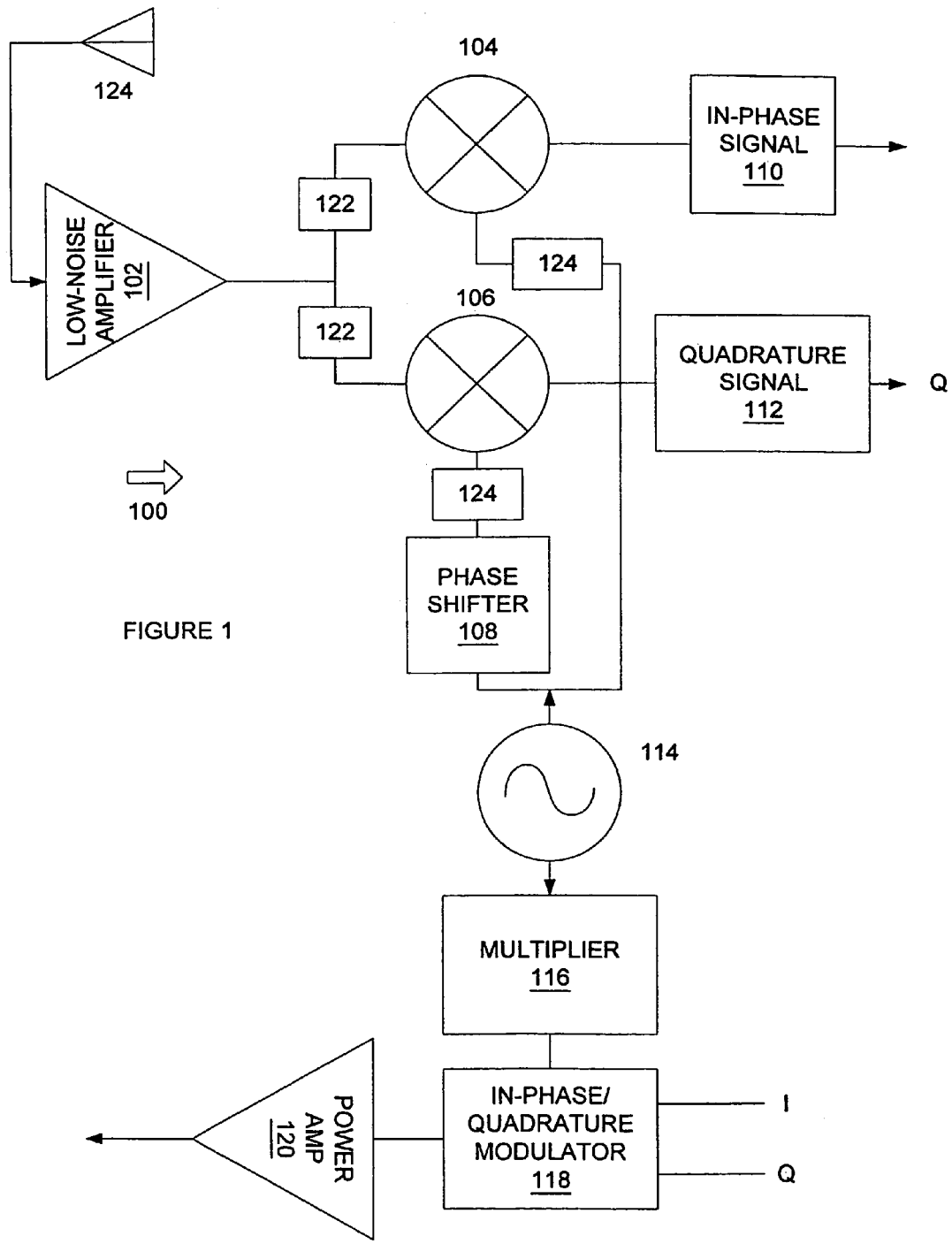
FIG. 1 is a diagram of a system for providing a direct conversion receiver and transmitter in accordance with an exemplary embodiment of the present invention.

In the description that follows, like parts are marked throughout the specification and drawings with the same reference numerals, respectively. The drawing figures might not be to scale, and certain components can be shown in generalized or schematic form and identified by commercial designations in the interest of clarity and conciseness.

FIG. 1 is a diagram of a system 100 for providing a direct conversion receiver and transmitter in accordance with an exemplary embodiment of the present invention. System 100 allows the local oscillator for a direct conversion receiver to also be used to modulate an outgoing signal to a transmission frequency, so as to reduce the number of components needed in a system for receiving and transmitting data. System 100 can be implemented in hardware or a suitable combination of hardware and software, and is preferably an integrated circuit that is on a single silicon wafer substrate.

System 100 includes low noise amplifier 102 that receives a carrier frequency signal from antenna 124. The carrier frequency signal includes a data signal that has been modulated onto the carrier frequency signal using a suitable modulation technique, such as quadrature phase shift keying, frequency modulation, or other suitable modulation. Low noise amplifier 102 is coupled to high-pass filters 122a and 122b. As used herein, the term "couple" and its cognate terms, such as "couples" and "coupled," can refer to a physical connection (such as through a copper conductor), a logical connection (such as through logical gates of a semiconducting circuit), a virtual connection (such as through randomly assigned memory locations of a data memory device), other suitable connections, or a combination of such connections. In one exemplary embodiment, systems and components are coupled to other systems and components through intervening systems or components, such as through a conductive layer of a semiconducting circuit.

High pass filters 122a and 122b are used to minimize the amount of leakage signal that may be received from local oscillator 114 by antenna 124 and related circuitry of system 100. In one exemplary embodiment, local oscillator 114 generates a signal having a frequency that is one-half of the carrier signal frequency, such that high pass filters 122a and 122b reduce the magnitude of the leakage signal by a suitable amount, such as −30 decibels. In this manner, the effect of the leakage signal can be reduced to a level that does not interfere with the carrier frequency signal received by antenna 124.

Mixers 104 and 106 receive the amplified carrier frequency signal from low noise amplifier 102 and mix the amplified carrier frequency signal with a local oscillator signal from local oscillator 114. Band pass filters 124a and 124b are used to remove high frequency components from the signal received from local oscillator 114, such as leakage signal from other components of system 100. As such, band pass filters 124a and 124b allow signals having the frequency of local oscillator 114 to pass, and, may either be low-pass filters that allow frequencies below those of local oscillator 114 to pass, or band-pass filters that block both high and low frequency signals.

Mixers 104 and 106 receive the signal from the local oscillator and multiply the signal by a numerical factor prior to mixing the signal with the carrier frequency signal. In one exemplary embodiment, the frequency of the carrier signal, the local oscillator 114, and the multiplication factor of mixers 104 and 106 are related, such that local oscillator 114 generates a signal at a subharmonic frequency of the carrier frequency, and the mixers multiply the local oscillator signal by a factor equal to the inverse of the subharmonic prior to mixing the local oscillator signal with the carrier frequency signal. In this manner, mixers 104 and 106 multiply the frequency of the local oscillator 114 to that of the carrier frequency, such that the output of mixers 104 and 106 is a signal having a frequency distribution around the base band frequency and a frequency distribution around the frequency centered at two times the carrier frequency.

Mixer 106 receives the signal from local oscillator 114 through phase shifter 108 and low-pass filter 124b. Phase shifter 108 shifts the phase of the local oscillator signal by a predetermined amount so as to create an output from mixer 106 that is shifted by 90°. The degree of phase shift of phase shifter 108 is thus coordinated with the frequency of local oscillator 114 and the carrier signal frequency.

In one exemplary embodiment, mixer 106 is a one-half local oscillator mixer that receives a local oscillator signal that is one-half of the frequency of the carrier signal frequency. In this exemplary embodiment, phase shifter 108 shifts the phase of the signal received from local oscillator 114 by 45 degrees, such that the phase shift becomes 90 degrees after being multiplied by mixer 106. In this manner, the phase of the signals generated by mixer 104 and mixer 106 is separated by 90° so that quadrature phase shift keying modulation can be detected.

Likewise, other suitable frequencies for phase shifter 108, local oscillator 114, mixer 104, and mixer 106 can be used. For example, mixers 104 and 106 can be one-third local oscillator and mixers, where the frequency of local oscillator 114 is one-third of the frequency of the carrier signal frequency, and phase shifter 108 shifts the frequency of the signal from local oscillator 114 by 30°.

In-phase signal circuit 110 and quadrature phase signal circuit 112 are coupled to mixers 104 and 106, respectively. In-phase signal circuit 110 and quadrature phase signal circuit 112 are used to amplify and filter the in-phase and quadrature phase signals, which are used to detect quadrature phase shift keying or other suitable modulation from the signal encoded on the carrier signal received by low noise amplifier 102.

Local oscillator 114 is a suitable oscillator, such as a voltage-controlled oscillator, that generates an oscillator signal at a predetermined frequency. In one exemplary embodiment, local oscillator 114 generates a signal having a frequency that is a subharmonic of the carrier frequency signal that is received and amplified by low noise amplifier 102, such as a one-half harmonic, a one-third harmonic, a one-quarter harmonic or other suitable harmonics. In this manner, signals generated by local oscillator 114 that radiate to connector circuitry between local oscillator 114 and antenna 124 will not result in the generation of a DC signal at the output of mixers 104 and 106.

Frequency multiplier 116 is coupled to local oscillator 114 and multiplies the frequency of the signal generated by local oscillator 114 by a predetermined factor. In one exemplary embodiment, the transmitter of system 100 may transmit a signal at the same frequency as the carrier signal frequency during periods when the receiver is not receiving the carrier signal. In this exemplary embodiment, frequency multiplier 116 multiplies the frequency of the signal output for mixer 114 by an amount corresponding to the inverse of the subharmonic of mixer 114. For example, if local oscillator 114 generates an oscillator signal having frequency that is one-half of the frequency of the carrier signal, frequency multiplier 116 multiplies this signal frequency by a factor of two. In another exemplary embodiment, if local oscillator 114 generates a signal having a frequency one-third of the carrier frequency, then frequency multiplier 116 multiplies the signal frequency by a factor of three. Other suitable factors may be used.

Frequency multiplier 116 can also be used to multiply the transmit carrier frequency to a level other than the receive carrier frequency. In this configuration, system 100 can simultaneously transmit and receive, and does not need to have the transmission periods coordinated with the reception periods. Likewise, frequency multiplier 116 can be excluded such that the transmit carrier frequency is equal to the local oscillator frequency.

In-phase/quadrature modulator 118 receives outgoing in-phase and quadrature signals and modulates the signals onto the carrier frequency received from frequency multiplier 116. For example, in-phase and quadrature signals can be used to perform quadrature phase shift keying on the signal received from frequency multiplier 116. This modulated signal is then provided to power amp 120 for transmission over an antenna.

In operation, system 100 is used to perform direct conversion reception of a carrier signal that has been modulated with encoded data, and further utilizes the same local oscillator frequency for transmission of a data signal generated at system 100. In this manner, system 100 can be used to receive and transmit a signal using a subharmonic local oscillator in a manner that minimizes the potential for feedback, direct current generation, and other unwanted effects in the direct conversion receiver and transmitter of system 100.

Figure 2:
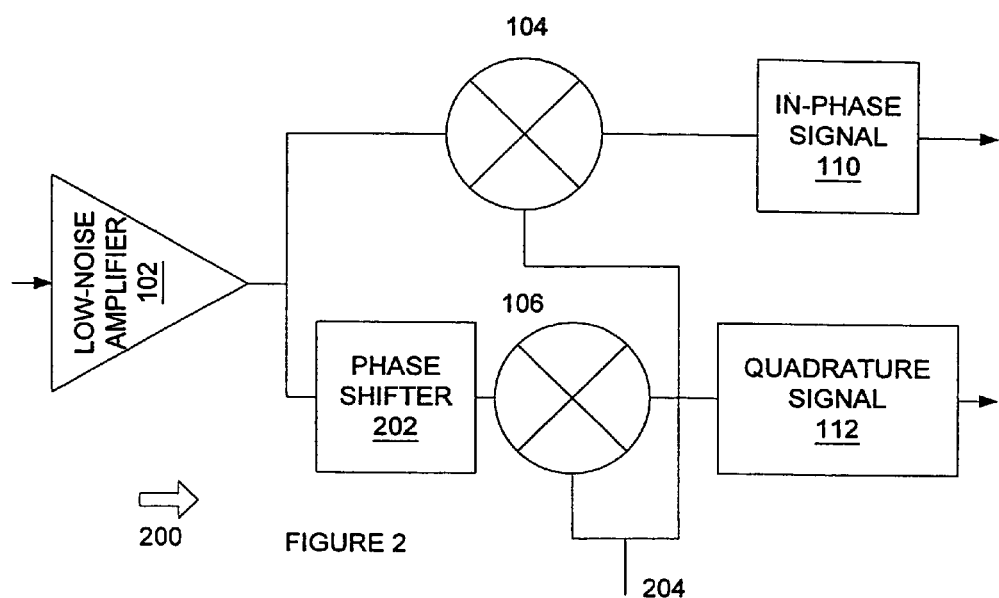
FIG. 2 is a diagram of a direct conversion receiver in accordance with an exemplary embodiment of the present invention.

FIG. 2 is a diagram of a direct conversion receiver 200 in accordance with an exemplary embodiment of the present invention. Direct conversion receiver 200 can be implemented in hardware or a suitable combination of hardware and software, and can be a single circuit that is part of an integrated circuit receiver/transmitter circuit that is embodied on a single silicon wafer die.

Direct conversion receiver 200 includes a phase shifter 202 that is coupled between low-noise amplifier 102 and mixer 106. In this configuration, phase shifter 202 shifts the incoming modulated carrier signal in order to produce the quadrature signal 112. Thus, the effect of phase shifter 202 is not multiplied by mixer. 106, as opposed to the configuration of system 100 where the amount of shift of the phase shifter on the subharmonic local oscillator signal is multiplied by the multiplication factor of mixer 106. Thus, phase shifter 202 can be used to shift the phase of the amplified carrier signal by 90 degrees instead of a fraction corresponding to the frequency of the local oscillator. In addition, suitable frequency filters, such as high-pass filters 122a and 122b, and low-pass filters 124a and 124b, can be also be used to reduce signal components created in the carrier frequency signal through leakage from the local oscillator or other system components.

In operation, direct conversion receiver 200 allows a carrier signal that is modulated with a data signal to be directly converted to the base band signal in a manner that reduces the amount of shielding required and the amount of D.C. offset generated. Direct conversion receiver 200 can be combined with a transmitter that uses the same local oscillator as that used by direct conversion receiver 200, so as to reduce the number of components required and to allow a receiver and transmitter circuit to be fabricated on a single silicon wafer die.

Figure 3:
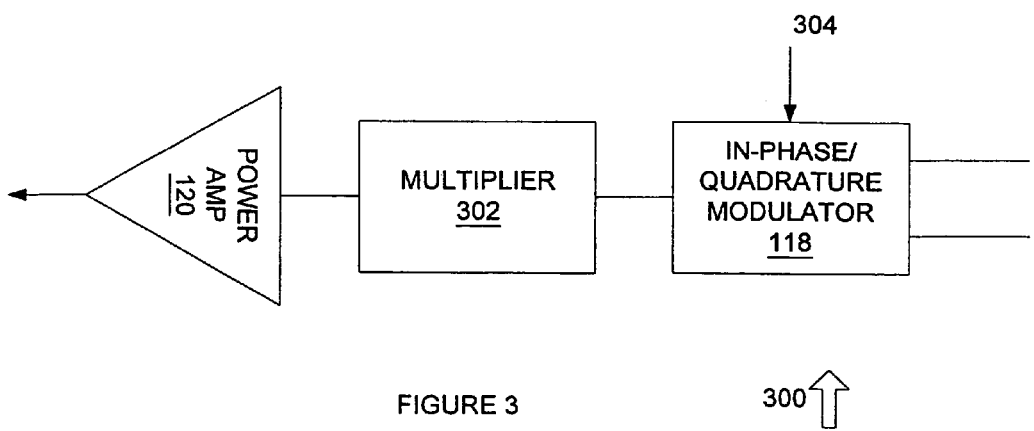
FIG. 3 is a diagram of a transmitter for transmitting an outgoing data signal in accordance with an exemplary embodiment of the present invention.

FIG. 3 is a diagram of a transmitter 300 for transmitting an outgoing data signal in accordance with an exemplary embodiment of the present invention. Transmitter 300 can be implemented in hardware or a suitable combination of software and hardware, and can be a single circuit that is part of an integrated circuit receiver/transmitter circuit that is embodied on a single silicon wafer die.

Transmitter 300 receives a signal from a local oscillator at in-phase/quadrature modulator 118, which also receives data encoded in a quadrature phase shift keyed signal or other suitable modulation. In-phase/quadrature modulator then modulates the signal received from the local oscillator with the quadrature phase shift keyed or otherwise modulated signal to generate an outgoing data signal. The frequency of the outgoing data signal is then multiplied by multiplier 302, and is subsequently amplified by power amp 120. Thus, the outgoing carrier signal carrying the encoded outgoing data signal is multiplied after the local oscillator signal is modulated with the data signal. As a result, the quadrature phase sift keyed or otherwise modulated signal that is encoded onto the local oscillator signal must have a phase shift corresponding to the inverse of the multiplication factor applied at in-phase/quadrature modulator 118 in order to properly decode the encoded data. The outgoing data signal can also be transmitted after modulation without frequency multiplication.

In one exemplary embodiment, a multiplication factor of two is applied by multiplier 302 to the local oscillator signal, such that the phase shift applied at in-phase/quadrature modulator 118 must be one-half of the phase shift that will be required by the signal receiver in order to properly decode the encoded data. Thus, if the transmitted data signal is to have a keyed phase shift of 90 degrees, then the phase shift applied at in-phase/quadrature modulator 118 would be 45 degrees in this exemplary embodiment.

In operation, transmitter 300 allows a single local oscillator to be used to modulate a carrier signal for a direct conversion receiver and to transmit an outgoing data signal. Modulation of the outgoing data signal by transmitter 300 is performed prior to multiplication of the signal up to the outgoing carrier frequency. Transmitter 300 allows a receiver and transmitter circuit to be fabricated on a single silicon wafer die.

Figure 4:
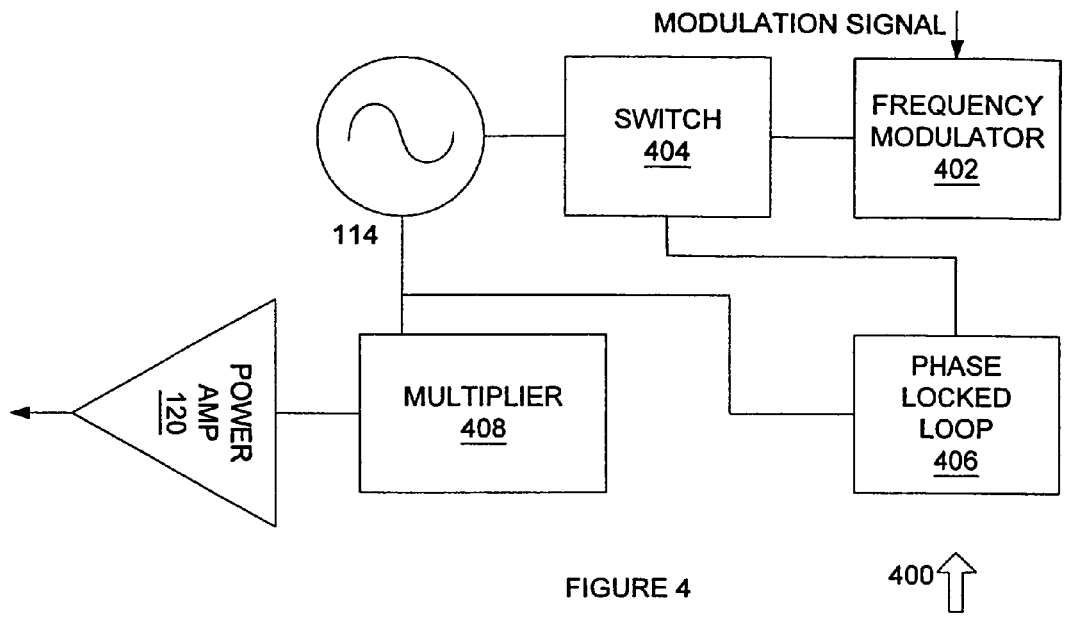
FIG. 4 is a diagram of a transmitter for transmitting a signal in accordance with an exemplary embodiment of the present invention.

FIG. 4 is a diagram of a transmitter 400 for transmitting a signal in accordance with an exemplary embodiment of the present invention. Transmitter 400 can be implemented in hardware or a suitable combination of software and hardware, and can be a single circuit that is part of an integrated circuit receiver/transmitter circuit that is embodied on a single silicon wafer die.

Transmitter 400 includes frequency modulator 402 which is used to modulate an outgoing data signal onto the signal generated by local oscillator 114. Switch 404 is coupled to frequency modulator 402 and phase locked loop 406, such that when switch 404 is closed, the circuit including frequency modulator 402 and switch 404 allows local oscillator 114 to be modulated with the signal of frequency modulator 402 without drifting from the desired local oscillator frequency for a short period of time. In this manner, frequency modulator 402 can be used to modulate the signal generated by local oscillator 114 during predetermined cycles. In one exemplary embodiment, a predetermined receive period and transmit period are used, such that a single carrier frequency can be used to receive and transmit data from the direct conversion receiver.

Switch 404 is used to allow transmitter 400 to transmit during the transmit period, and interrupts transmission during the receive period. In this exemplary embodiment, multiplier 408 and power amp 120 are on during transmit and off during receive. In one exemplary embodiment, switch 404 can detect the transmit and receive cycles, such as by receiving a local clock signal and the incoming data signal. In another exemplary embodiment, switch 404 receives a control signal from a controller that causes switch 404 to connect local oscillator 114 to the phase locked loop 406 during the receive cycle and to connect local oscillator 114 to the frequency modulator 402 during the transmit cycle. Other suitable configurations may be used.

Local oscillator 114 is coupled to multiplier 408, which multiplies the frequency of the modulated data signal received from local oscillator 114 by a predetermined multiple. Frequency modulator 402 modulates the local oscillator signal 114 at a predetermined inverse multiple of this multiplier frequency. In one exemplary embodiment, where local oscillator 114 generates a signal that is one-half of the frequency of the carrier signal, then frequency modulator 402 modulates the frequency of local oscillator 114 at one-half of the transmitted modulation rate that will correspond to the data that is being encoded and transmitted.

In operation, transmitter 400 allows a single local oscillator to be used to modulate a carrier signal for a direct conversion receiver and to transmit an outgoing data signal. A phase-locked loop and switch are used by transmitter 400 to maintain the local oscillator at the desired frequency and to control transmission and reception periods, respectively. Transmitter 400 allows a receiver and transmitter circuit to be fabricated on a single silicon wafer die.

Figure 5:
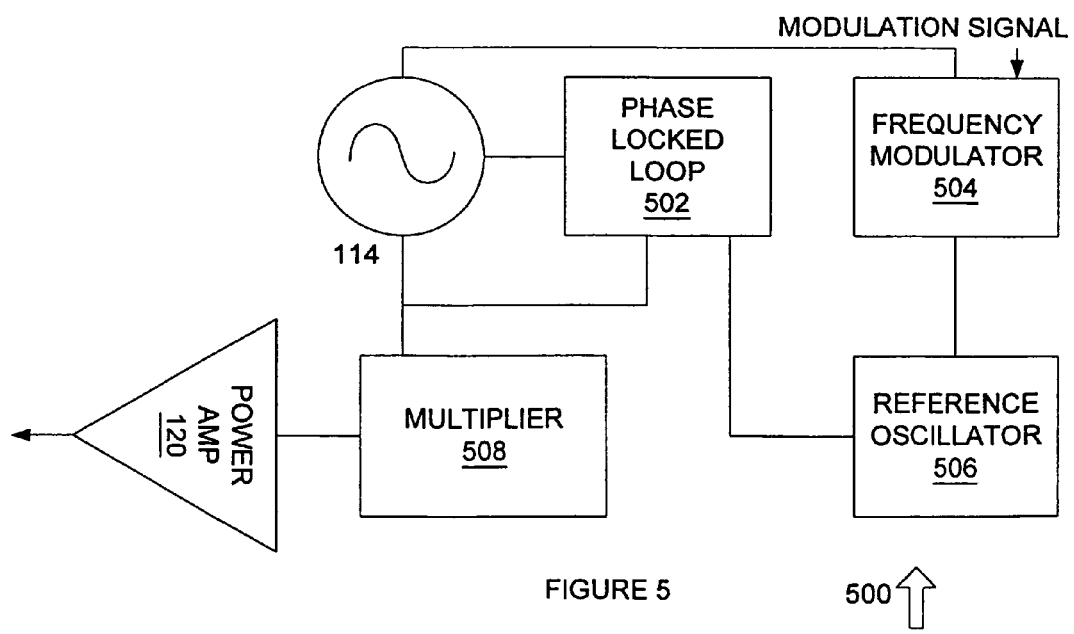
FIG. 5 is a diagram of a transmitter for transmitting a signal in accordance with an exemplary embodiment of the present invention.

FIG. 5 is a diagram of a transmitter 500 for transmitting a signal in accordance with an exemplary embodiment of the present invention. Transmitter 500 can be implemented in hardware or a suitable combination of software and hardware, and can be a single circuit that is part of an integrated circuit receiver/transmitter circuit that is embodied on a single silicon wafer die.

Transmitter 500 includes phase locked loop 502 which is coupled to local oscillator 114 and which maintains local oscillator 114 at a predetermined frequency. Frequency modulator 504 is coupled to local oscillator 114 and reference oscillator 506, and modulates an outgoing data signal onto the signal generated by local oscillator 114. Phase locked loop 502 remains locked during both transmit and receive cycles. During transmit, frequency modulator 504 applies modulation to local oscillator 114. Since phase locked loop 502 is locked, phase locked loop 502 will tend to remove the low-frequency portion of the modulation. To prevent this, the modulation is also applied to the reference oscillator 506. The frequency of the signal output by local oscillator 114 with the modulated data signal is then multiplied by multiplier 508, and is then amplified to a transmission power level by power amp 120. The modulation frequency of frequency modulator 504 is therefore adjusted to compensate for the subsequent multiplication by multiplier 508, so as to result in a transmitted signal having a modulation that allows the encoded outgoing data signal to be detected and extracted.

In one exemplary embodiment, the outgoing data signal provided to frequency modulator is controlled so that no signal is provided during a receive cycle, and an outgoing data signal is provided during a transmit cycle. Other suitable configurations can also be used.

In operation, transmitter 500 allows a single local oscillator to be used to modulate a carrier signal for a direct conversion receiver and to transmit an outgoing data signal. Transmitter 500 allows a receiver and transmitter circuit to be fabricated on a single silicon wafer die.

Figure 6:
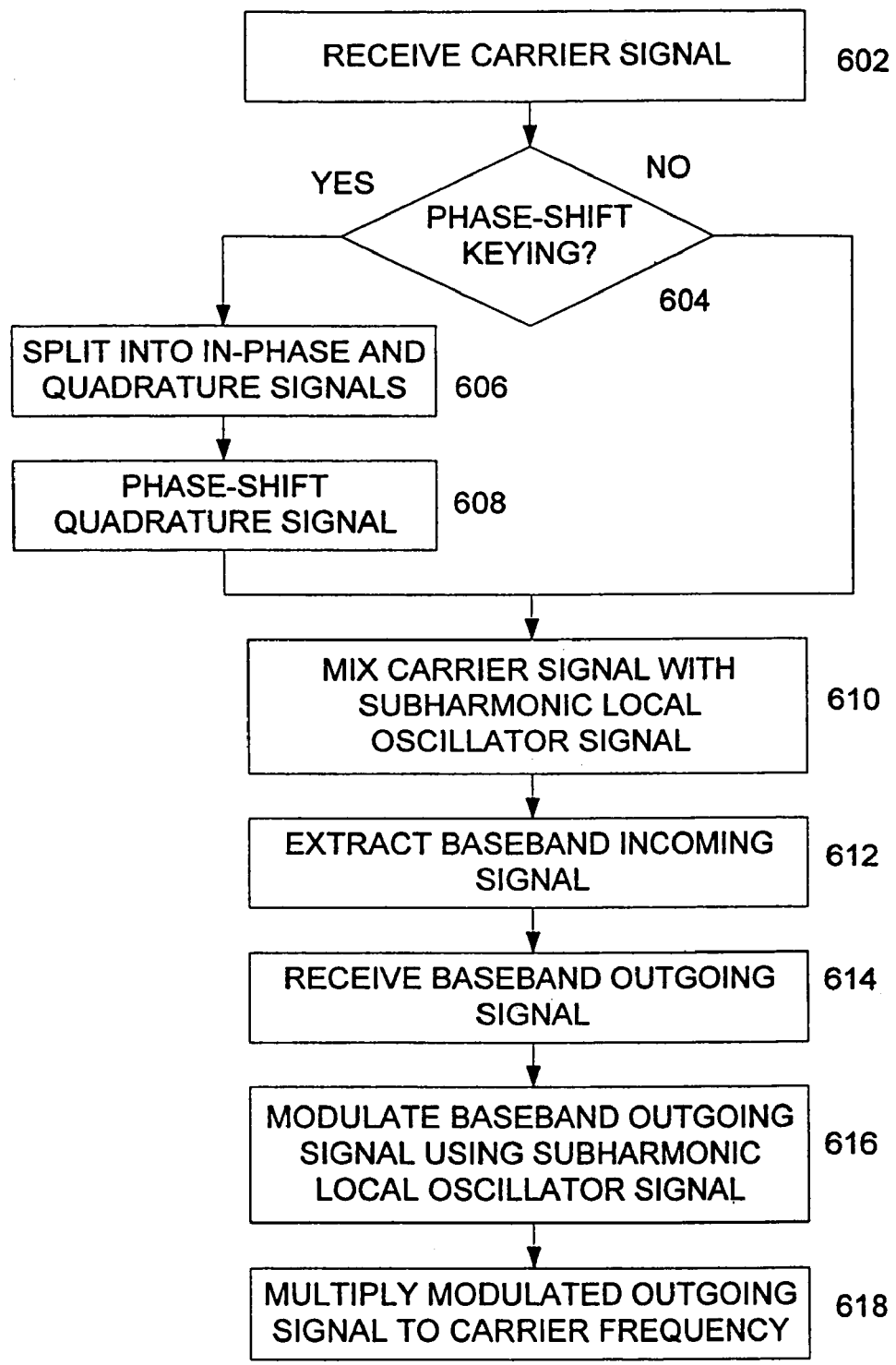
FIG. 6 is a diagram of a method for using a direct conversion receiver and transmitter in accordance with an exemplary embodiment of the present invention.

FIG. 6 is a diagram of a method 600 for using a direct conversion receiver and transmitter in accordance with an exemplary embodiment of the present invention. Method 600 allows a single local oscillator to be used to receive and transmit data, and reduces the effect of leakage fields from the local oscillator on the received signal.

Method 600 begins at 602 where a carrier signal having an encoded data signal is received. The carrier signal is transmitted at a predetermined frequency and includes an encoded data signal that is modulated onto the carrier signal using a suitable modulation technique, such as quadrature phase shift keying. The method then proceeds to 604 where it is determined whether phase shift keying is being used. The method may also be implemented using a circuit in which phase shift keying is always used, or in which phase shift keying is not used, such that the process of determining whether phase shift keying is being used is not performed. If phase shift keying is not being used, the method proceeds directly to 610. Otherwise, method proceeds to 606.

At 606, the carrier signal is split into an in-phase and quadrature phase signal. The method then proceeds to 608 where the quadrature phase signal is phase shifted. In one exemplary embodiment, the quadrature phase signal is phase shifted by phase shifting the carrier signal by 90 degrees. In another exemplary embodiment, the quadrature phase signal is phase shifted by phase shifting a subharmonic local oscillator signal by a factor corresponding to the inverse of the subharmonic frequency, such that when the local oscillator signal is multiplied and mixed with the carrier signal, the phase shift factor is multiplied so as to equal 90 degrees. The method then proceeds to 610.

At 610, the carrier signal is mixed with the subharmonic local oscillator signal through a subharmonic mixer so as to generate a base band signal and a signal at two times the frequency of the carrier signal. In one exemplary embodiment, the carrier signal can be mixed with a one-half local oscillator signal using a one-half local oscillator mixer. The method then proceeds to 612 where the base band incoming signal is extracted. The base band incoming signal can be extracted as an in-phase component and a quadrature phase component, so as to facilitate decoding of a quadrature phase shift keyed data signal. The method then proceeds to 614.

At 614, an outgoing data signal is received from a data source. The method then proceeds to 616 where the outgoing data signal is modulated using a subharmonic local oscillator signal. In one exemplary embodiment, an in-phase and quadrature phase modulator is used to modulate the outgoing data signal onto the local oscillator signal. In another exemplary embodiment, a frequency modulator is used to modulate the local oscillator signal with the outgoing data signal. The method then proceeds to 618 where the frequency of the modulated outgoing data signal is multiplied to the carrier frequency. The multiplication can be performed prior to modulation of the local oscillator signal. Likewise, the multiplication can be performed after modulation, where the outgoing data signal is modulated onto the local oscillator signal at a factor corresponding to the subharmonic frequency of the local oscillator. For example, if the subharmonic frequency of the local oscillator is one-half of the carrier frequency, then the data in the outgoing data signal is modulated at one-half of the frequency required for the data to be received and decoded by a receiver. Other suitable procedures can be used.

In operation, method 600 is used to receive an incoming data signal and to transmit an outgoing data signal using a direct conversion receiver or other suitable receiver and a local oscillator having a frequency that is a subharmonic of the carrier frequency. Method 600 thus allows direct conversion receivers or other suitable receivers to be used without shielding or DC offset compensation, and further allows the local oscillator to be used with the transmitter to modulate the outgoing data stream to a carrier frequency or other suitable frequency for transmission.

Figure 7:
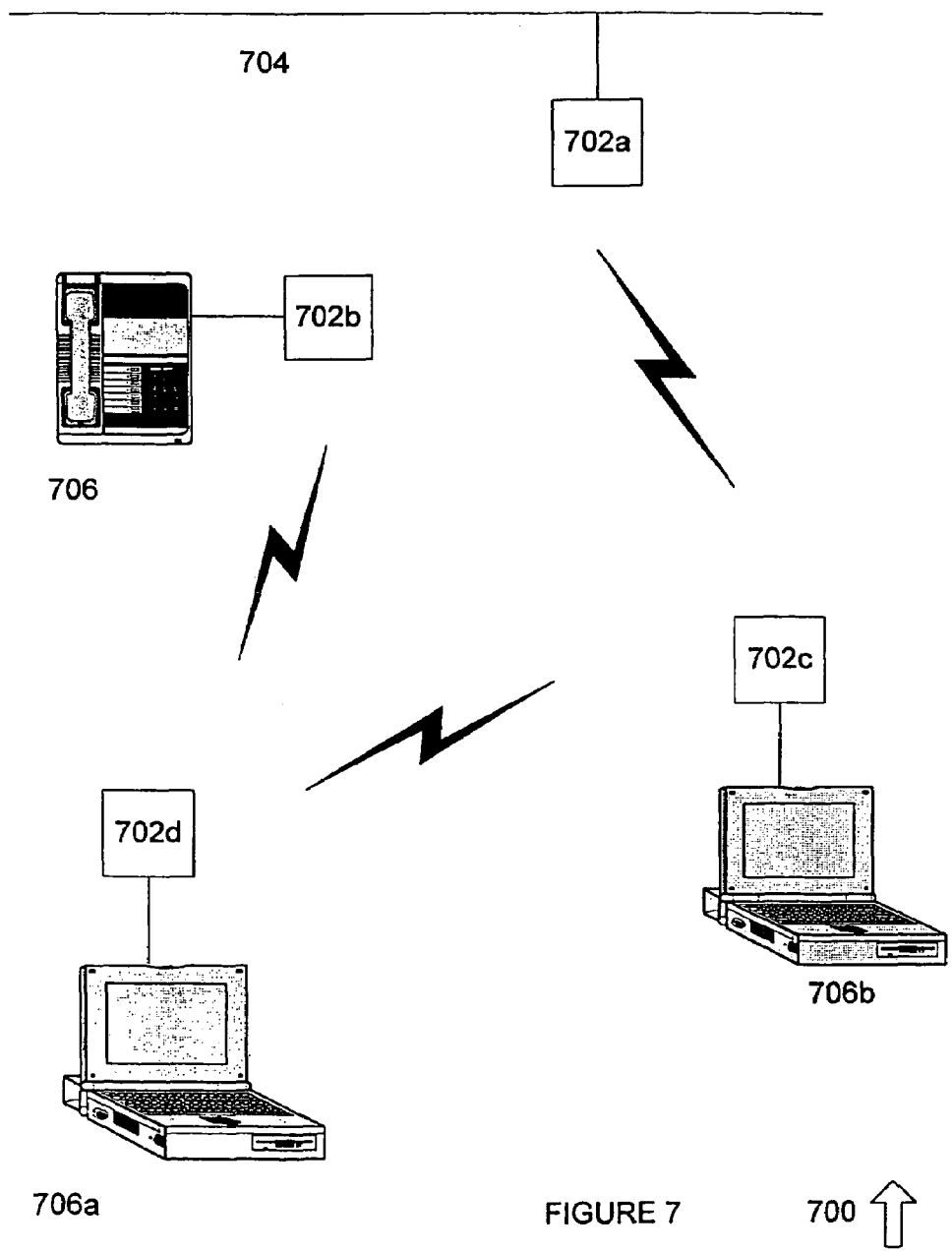
FIG. 7 is a diagram of a system in which systems and components interface via a direct conversion receiver and transmitter, in accordance with an exemplary embodiment of the present invention.

FIG. 7 is a diagram of a system 700 in which systems and components interface via a direct conversion receiver and transmitter, in accordance with an exemplary embodiment of the present invention. System 700 allows systems and components to interface via a wireless connection over short distances in a manner that is economical and lightweight.

System 700 includes direct conversion receiver and transmitters 702a through 702d, which can include features from systems 100 through 500 of the present invention, plus additional interface circuitry to allow digitally-encoded data in the incoming data signal to be extracted and provided to an attached system or component, and to receive an outgoing data stream from the attached system or component for transmission to other systems and components. In the exemplary embodiment shown in FIG. 7, direct conversion receiver and transmitter 702a is coupled to local area network 704, direct conversion receiver and transmitter 702b is coupled to a telephone 706, and direct conversion receiver and transmitters 702c and 702d are coupled to laptop computers 706a and 706b. These components can send and receive data to the other components using the wireless connection provided by direct conversion receiver and transmitters 702a through 702d. The light weight and low cost of direct conversion receiver and transmitters 702a through 702d allow wireless connections to be inexpensively provided for many devices and in many situations where providing such wireless connectivity would otherwise be prohibitively expensive.

Although exemplary embodiments of a system and method for a direct conversion receiver and transmitter have been described in detail herein, those skilled in the art will also recognize that various substitutions and modifications can be made to the systems and methods without departing from the scope and spirit of the appended claims.

What is claimed is:

1. A system for transmitting and receiving data, comprising:
   a direct-conversion receiver with a subharmonic local oscillator mixer for receiving a signal modulated on a carrier frequency signal;
   a local oscillator connected to the direct conversion receiver; and
   a transmitter, comprising:
      a frequency modulator for modulating the local oscillator;
      a phase locked loop coupled to the frequency modulator and the local oscillator; and
      switch for connecting the phase locked loop to the local oscillator during a transmit cycle and can disconnecting the phase locked loop from the local oscillator during a receive cycle.

2. A system for transmitting and receiving data, comprising:
   a direct-conversion receiver with a subharmonic local oscillator mixer for receiving a signal modulated on a carrier frequency signal;
   a local oscillator connected to the direct conversion receiver; and
   a transmitter, comprising:
      a frequency modulator for modulating the local oscillator;
      a voltage-controlled reference oscillator connected to the frequency modulator, where the voltage-controlled reference oscillator is modulated by the frequency modulator; and
      a phase locked loop connected to the local oscillator in a feedback loop, the phase locked loop further coupled to the voltage controlled oscillator.

3. A system for transmitting and receiving data comprising:
   a low noise amplifier receiving a modulated incoming carrier signal having a carrier signal frequency;
   a local oscillator generating a local oscillator signal having a local oscillator frequency equal to a subharmonic frequency of the carrier signal such that the local oscillator frequency is 1/N times a frequency of the carrier frequency signal;
   a first mixer for generating an in-phase incoming data signal;
   a second mixer for generating a quadrature phase incoming data signal;
   a frequency multiplier for producing a multiplied local oscillator frequency signal by multiplying the local oscillator signal by N;
   a modulator connected to the local oscillator, the modulator receiving an outgoing data signal and modulating the outgoing data signal onto the local oscillator signal using the multiplied local oscillator frequency signal to generate an outgoing modulated carrier signal; and
   a transmit amplifier connected to the modulator, the transmit amplifier amplifying the outgoing modulated carrier signal to a transmission power level.

4. The system of claim 3 further comprising a general purpose computing platform connected to the first mixer, the second mixer, and the modulator, the general purpose computing platform decoding an incoming data signal from the in-phase incoming data signal and the quadrature phase incoming data signal, and generating the outgoing data signal.

5. The system of claim 3 further comprising a telephone handset connected to the first mixer, the second mixer, and the modulator, the telephone handset decoding an incoming data signal from the in-phase incoming data signal and the quadrature phase incoming data signal, and generating the outgoing data signal.

6. The system of claim 3 wherein an antenna is directly connected to the low noise amplifier, and the low noise amplifier is directly connected to the one or more subharmonic local oscillator mixers.

* * * * *